(12) United States Patent
Wong

(10) Patent No.: US 6,232,165 B1
(45) Date of Patent: *May 15, 2001

(54) BURIED GUARD RINGS AND METHOD FOR FORMING THE SAME

(75) Inventor: Shyh-Chyi Wong, Taichung (TW)

(73) Assignee: Winbond Electronics Corporation, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/207,630

(22) Filed: Dec. 9, 1998

(51) Int. Cl.$^7$ ................................................ H01L 21/8238
(52) U.S. Cl. .................... 438/221; 438/223; 438/224; 438/424; 438/232
(58) Field of Search ..................... 438/199, 218, 438/221, 223, 224, 424, 425, 225, 227, 228, 230, 231, 232

(56) References Cited

U.S. PATENT DOCUMENTS

| 4,599,789 | * | 7/1986 | Gasner . |
| 5,296,392 | * | 3/1994 | Grula et al. . |
| 5,369,595 | * | 11/1994 | Gould et al. . |
| 5,770,504 | * | 6/1998 | Brown et al. ........................ 438/296 |
| 5,888,881 | * | 3/1999 | Jeng et al. ........................... 438/425 |
| 5,976,939 | * | 11/1999 | Thompson et al. .................. 438/305 |
| 5,989,977 | * | 11/1999 | Wu ...................................... 438/431 |

* cited by examiner

Primary Examiner—Long Pham
(74) Attorney, Agent, or Firm—Finnegan, Henderson, Farabow, Garrett & Dunner, L.L.P.

(57) ABSTRACT

A twin-well CMOS integrated circuit device includes an n-well region and a p-well region. Each of the n-well and p-well region includes spaced-apart regions which serve as drain and source regions, a channel region between the spaced-apart regions, a shallow trench isolation structure contiguous with one of the spaced-apart regions, and a doped diffused region extending from the surface of the well region, around and underneath the trench isolation structure, to a region beneath the contiguous spaced-apart region.

10 Claims, 4 Drawing Sheets

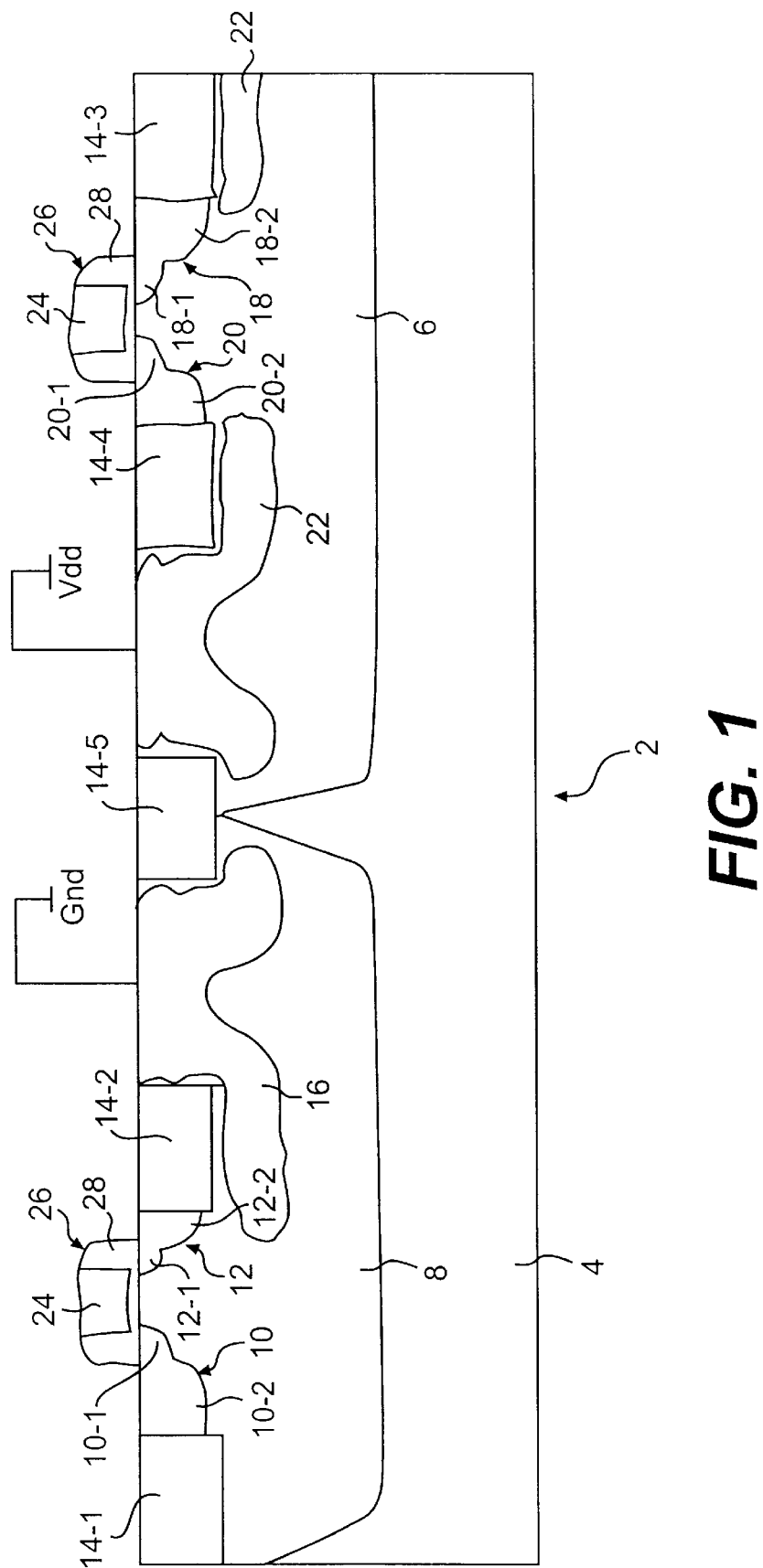

BURIED GUARD RINGS AND METHOD FOR FORMING THE SAME

BACKGROUND OF THE INVENTION

1. Field of the Invention

This invention pertains in general to a structure to absorb minority charge carriers within an MOS transistor and, more particularly, to buried guard rings to prevent latch-up in a complementary metal-oxide semiconductor ("CMOS") integrated circuit.

2. Description of the Related Art

A CMOS integrated circuit device, by definition, includes at least one p-channel and one n-channel metal-oxide semiconductor field-effect transistor ("MOSFET"). The formation of the MOSFETs leads to the formation of parasitic bipolar junction transistors ("BJTs"). During normal device operations, parasitic transistors are not turned-on and therefore do not affect device operations. However, under certain transient conditions, such as voltage surges, parasitic BJTs may be turned-on and the device is said to be "latched-up."

A parasitic BJT may be turned-on by migrating charge carriers, such as holes to the base, or the n-well region, of a pnp BJT and electrons to the base, or the p-well region, of an npn BJT. Charge carriers can also migrate from the substrate beneath the active regions of the CMOS circuit. In addition, because the collector of a pnp BJT is connected to the base of an npn BJT and the collector of the npn BJT is connected to the base of the pnp BJT, when one parasitic BJT is turned-on by the migrating charge carriers, the other BJT will also be turned on. In addition, if one npn-pnp BJT pair is turned-on, other parasitic BJT pairs in the device will likewise be turned-on, thereby creating a feedback loop within the device. Such a feedback loop consumes power, reduces device speed, and sometimes renders the device inoperative. Once formed, the feedback loop cannot be severed easily. The probability of latch-up increases as device size becomes smaller because undesired charge carriers that create the latch-up triggering current have a greater chance of reaching the areas of the device to trigger latch-up.

Latch-ups may be prevented by stopping the migration of charge carriers or substantially reducing the number of migrating charge carriers. Two known methods have been employed to prevent latch-ups. One method employs "guard rings," or heavily doped p-type material in a p-well and heavily doped n-type material in an n-well that act as "sinks" to divert the undesired minority charge carriers away from the parasitic BJTs. Guard rings are inserted from the surface to form vertical barriers to charge carrier flow and prevent latch-up by reducing the number of electrons and holes that reach critical parts of the CMOS device to trigger latch-up.

The other method places insulating materials in the shallow surface between active regions of the device to act as barriers to carrier charge flow. These insulating barriers are known as shallow trench isolation ("STI") structures.

Because the depth of guard rings and STIs is limited by the fabrication process, charge carriers may still migrate underneath them. Therefore, neither method, by itself or in combination, effectively prevents the flow of carriers to or from the substrate. This charge carrier flow is also known as leakage current.

SUMMARY OF THE INVENTION

Accordingly, the present invention is directed to buried guard rings that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawing.

To achieve these and other advantages, and in accordance with the purpose of the invention as embodied and broadly described, there is provided a CMOS integrated circuit device that includes a first well region of a first conductivity type in the device substrate and a second well region contiguous with the first well region. The first well region includes first and second spaced-apart regions of a second conductivity type, a channel region between the first and second spaced-apart regions, a trench isolation structure contiguous with the first spaced-apart region, and a doped diffused region. The doped diffused region extends at least between a region underneath the trench isolation structure and a region underneath the first spaced-apart region. The doped diffused region is a first conductivity type.

In another aspect, the doped diffused region is connected to ground.

In yet another aspect, the doped diffused region is connected to a voltage source.

Also in accordance with the invention, there is provided a twin-well CMOS integrated circuit device that includes a semiconductor substrate, a p-well region in the substrate and an n-well region in the substrate. The p-well region includes first and second spaced-apart n-type regions, a channel region between the first and second spaced-apart regions, a first trench isolation structure contiguous with the first spaced-apart region, and a p-type doped diffused region that extends between at least a region underneath the first trench isolation structure and a region underneath the first spaced-apart region. The n-well region is contiguous with the p-well region and includes third and fourth spaced-apart n-regions, a channel region between the third and fourth spaced-apart regions, a second trench isolation structure contiguous with the third spaced-apart region, and an n-type doped diffused region extending between at least a region underneath the second trench isolation structure and a region underneath the third spaced-apart region.

Further in accordance with the invention, there is provided a method for forming a buried guard ring. The method includes the steps of forming a plurality of shallow trenches, providing a first photoresist over the substrate, patterning and defining the photoresist, implanting the substrate with a dopant to form a diffused region, and removing the photoresist. The method also includes the steps of oxidizing the substrate to grow oxides inside the plurality of shallow trenches, forming an MOS device over the substrate, which comprises the steps of forming spaced-apart regions and forming a gate structure including a gate electrode and a gate insulator having spacer oxides, and implanting heavy dopants into the diffused region and the spaced-apart regions.

It is to be understood that both the foregoing general description and the following detailed description are exemplary and explanatory and are intended to provide further explanation of the invention as claimed.

BRIEF DESCRIPTION OF THE DRAWING

The accompanying drawings, which are incorporated in and constitute a part of this specification, illustrate an embodiment of the invention and, together with the description, serve to explain the objects, advantages, and principles of the invention.

In the drawings:

FIG. 1 shows a cross-sectional view of a twin-well CMOS device with buried guard rings in accordance with the present invention.

DETAILED DESCRIPTION OF THE PREFERRED EMBODIMENTS

Figure 2A:
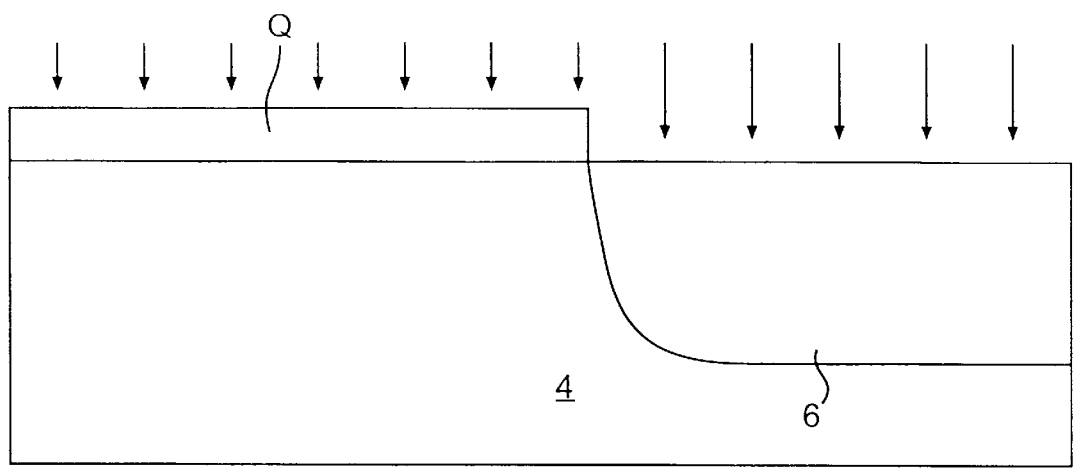
FIGS. 2A–2H show a cross-sectional view of the formation of a device with buried guard rings in accordance with the method of the present invention.

In accordance with the present invention, a CMOS device is provided with buried "buffer layers" of heavily doped p-type and n-type materials to reduce the number of electrons and holes, respectively, that may trigger device latch-up. These buried buffer layers, or buried guard rings, may be made to provide additional current paths to remove minority charge carriers collected by connecting the buried guard rings to a voltage source Vdd or ground, Gnd. Specifically, n-type buried guard rings are connected to Vdd and p-type buried guard rings are connected to ground.

An embodiment of the present invention is shown in FIG. 1, which shows a cross-sectional view of a twin-well CMOS integrated circuit device 2 having a p-type semiconductor substrate 4. One of ordinary skill in the art will understand that an n-type substrate may also be used to practice the present invention.

Device 2 includes an n-well region 6 that contains a p-type MOS ("PMOS") and a contiguous p-well region that contains an n-type MOS ("NMOS"). P-well region 8 includes spaced-apart n-type regions 10 and 12 that serve as drain and source regions, respectively. Drain 10 and source 12 include lightly-doped drain and source regions 10-1 and 12-1, and heavily-doped regions 10-2 and 12-2, respectively. P-well region 8 also includes a channel region (not numbered) between spaced-apart regions 10 and 12, and shallow trench isolation ("STI") structures 14-1 and 14-2 contiguous with spaced-apart regions 10 and 12, respectively. Each STI 14 (i.e., 14-1, 14-2, etc.) may be composed of a suitable dielectric material such as silicon dioxide. A gate structure including a gate electrode 24 and a gate insulator 26 is positioned above the channel region to complete the p-channel MOSFET structure. Gate insulator 26 includes sidewall oxides 28.

P-well region 8 additionally includes a substantially upside-down "U-shaped" p-type doped diffused region 16, or a buried guard ring. Diffused region 16 extends from the surface of p-well region 8, around and underneath the proximate STI 14-2, to a region beneath spaced-apart region 12. In a preferred embodiment, diffused region 16 does not laterally extend beyond spaced-apart region 12 to encroach the area below the channel region because such an encroachment would undesirably increase the device threshold. As shown in FIG. 1, diffused region 16 is connected to ground, Gnd.

Similarly, n-well region 6 includes spaced-apart p-type regions 18 and 20 that serve as drain and source regions, respectively. N-well region 6 includes a channel region (not numbered) between spaced-apart regions 18 and 20, and STIs 14-3 and 14-4 contiguous with spaced-apart regions 18 and 20, respectively. Region 18 includes a lightly-doped region 18-1 and a heavily-doped region 18-2 for the PMOS device and region 20 likewise includes a lightly-doped region 20-1 and a heavily-doped region 20-2. A gate structure including gate electrode 24 and gate insulator 26 is positioned over the channel region to complete the n-channel MOSFET structure.

N-well region 6 additionally includes a substantially upside-down U-shaped n-type doped diffused region 22 that extends from the surface of n-well region 6, around and underneath the proximate STI 14-4, to a region beneath spaced-apart region 20. In a preferred embodiment, diffused region 22 does not laterally extend beyond spaced-apart region 20 to encroach the area below the channel region. As shown in FIG. 1, diffused region 22 is connected to voltage source Vdd. Another STI 14-5 is formed between diffused regions 16 and 22. Each of diffused regions 16 and 22 diffuses and extends underneath STI 14-5.

In operation, the buried guard rings of the present invention extend into the device substrate to sink carriers. In addition, the buried guard rings extend into regions underneath STIs and drain or source region of a MOSFET to more effectively sink the carriers as compared to conventional guard rings.

A method in accordance with the present invention is explained with reference to FIGS. 2A–2H. Although FIGS. 2A–2H show the formation of only one substantially upside-down U-shaped diffused region in each of the NMOS and PMOS of CMOS device 2, the figures are for illustrative purposes only and should not be construed to limit the application of the present invention.

Figure 2B:
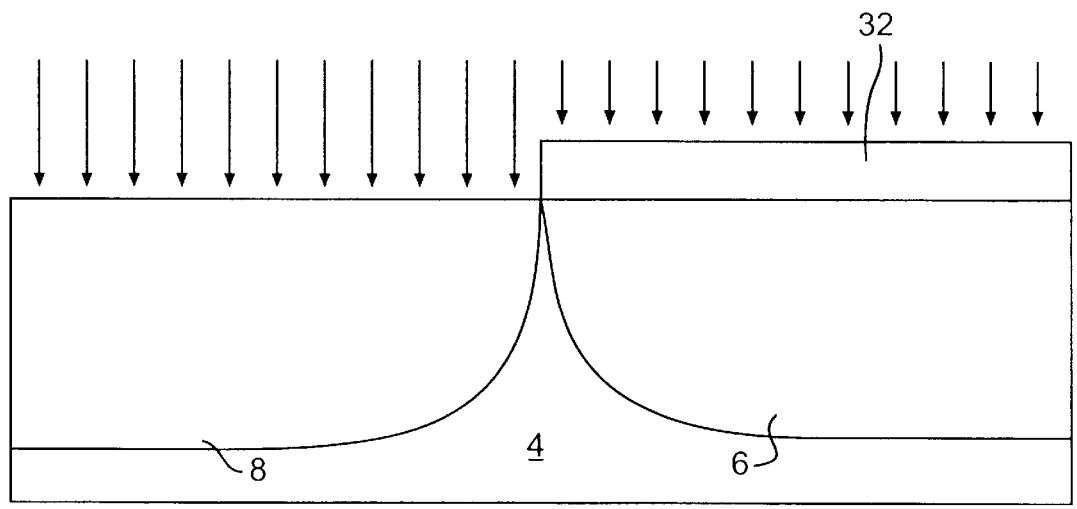

Referring to FIG. 2A, after substrate 4 is defined, a first photoresist 30 is disposed over substrate 4. First photoresist 30 is patterned to remove a portion where n-well region 6 is to be formed. With the remaining photoresist 30 as a mask, substrate 4 and is doped with phosphorus P to form n-well region 6. First photoresist 30 is then removed. Referring to FIG. 2B, a second photoresist 32 is similarly disposed over substrate 4 and patterned to define p-well region 8. With photoresist 32 as a mask, substrate 4 is doped with boron B to form p-well region 8. Second photoresist 32 is removed.

Figure 2C:
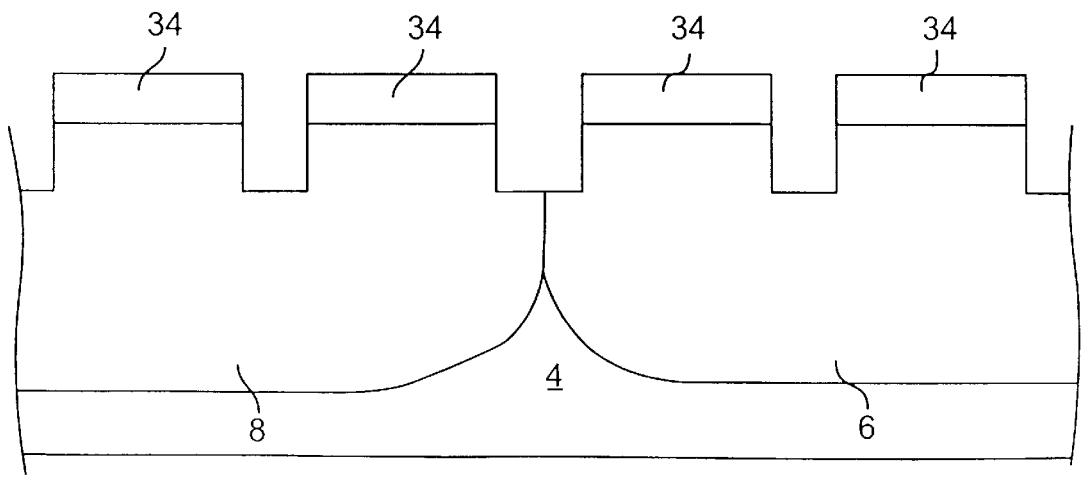

FIG. 2C shows the formation of a plurality of shallow trenches. Referring to FIG. 2C, a third photoresist 34 is disposed over substrate 4 and patterned to remove a plurality of portions where shallow trenches are to be formed. Areas of substrate 4 not covered by photoresist 34 are lightly etched, forming a plurality of shallow trenches. Third photoresist 34 is then removed.

Figure 2D:
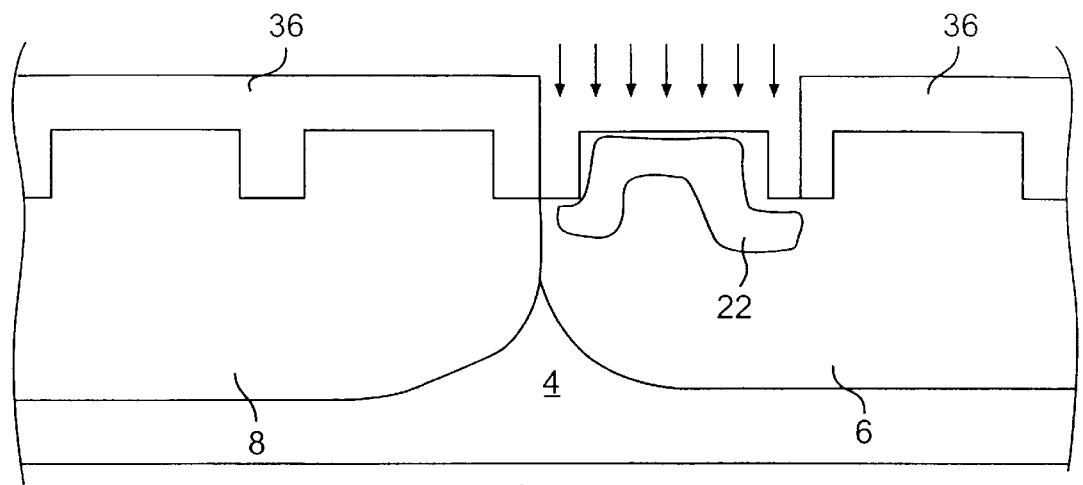
Figure 2E:
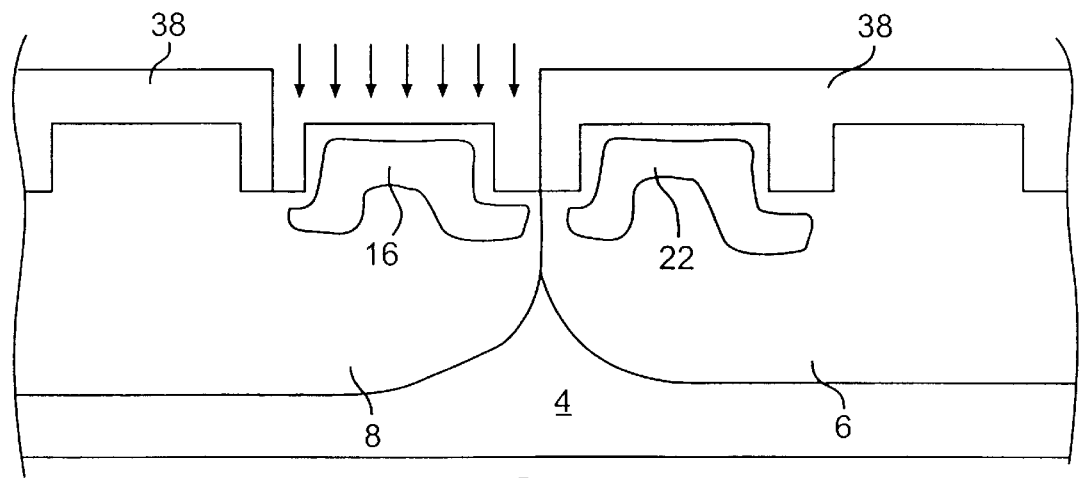
Figure 2F:
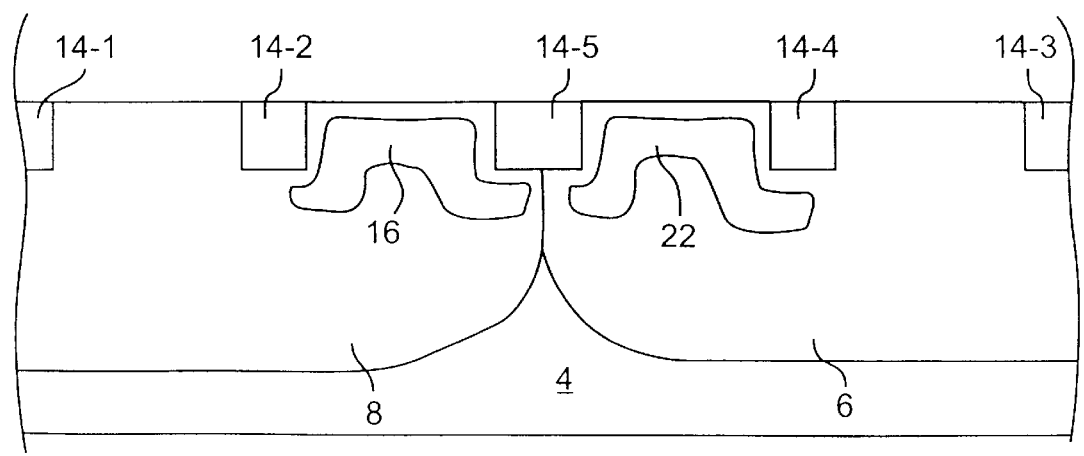

FIGS. 2D and 2E show the formation of n-type diffused region 22 and p-type diffused region 16. Referring to FIG. 2D, a fourth photoresist 36 is disposed over substrate 4 and patterned to form n-type doped diffused region 22 in n-well region 6. With photoresist 36 as a mask, substrate 4 is doped with phosphorus P or arsenic As to form n-type doped diffused region 22. Specifically, diffused region 22 is formed by doping P or AS at a dose of approximately $10^{12}$ to $10^{14}$ per $cm^2$ at an energy of approximately between 20 KeV to 60 KeV. The dopant implanted in substrate 4 diffuses to form substantially upside-down U-shaped region 22. Photoresist 36 is then removed. P-type diffused region 16 is similarly formed. Referring to FIG. 2E, a fifth photoresist 38 is disposed over substrate 4 and patterned to form diffused region 16 in p-well region 8. With photoresist 38 as a mask, substrate 4 is doped with $BF_2$ to form p-type doped diffused region 16. Specifically, diffused region 16 is formed by doping $BF_2$ at a dose of approximately $10^{12}$ to $5\times10^{12}$ per $cm^2$ at an energy of approximately between 20 KeV to 60 KeV. The dopant implanted in substrate 4 diffuses to form substantially upside-down U-shaped region 16. After photoresist 38 is removed, STIs are formed inside the shallow trenches. Referring to FIG. 2F, through oxidation process, oxide is grown in the plurality of shallow trenches to form STIs 14-1, 14-2, 14-3, 14-5, and 14-5.

Convention steps may be then employed to complete the p-channel MOSFET structure and the n-channel MOSFET structure as shown in FIG. 1. Specifically, a PMOS may be formed in n-well region 6 to include spaced-apart p-type regions 18 and 20, and a channel region. Regions 18 and 20 may be formed by doping the respective regions with B. Heavily-doped regions 18-2 and 20-2 will be formed at a later step. A gate structure including gate electrode 24 and gate insulator 26, which includes oxides 28, is positioned over the channel region to complete the PMOS structure. Similarly, an NMOS may be formed in p-well region 8 to include spaced-apart n-type regions 10 and 12. Regions 10 and 12 may be formed by doping the respective regions with P or As. Heavily-doped regions 10-2 and 12-2 will beformed at a subsequent step. P-well region 8 also includes a channel region between spaced-apart regions 10 and 12. A gate structure including gate electrode 24 and gate insulator 26, which includes sidewall oxides 28, is positioned above the channel region to complete the PMOS structure.

Figure 2G:
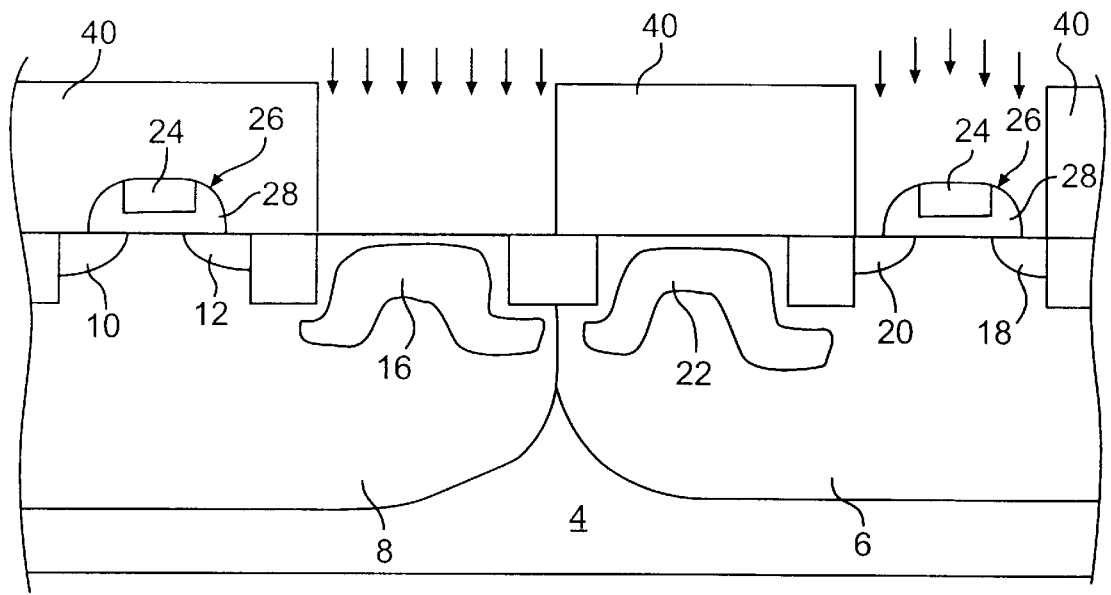

After forming the PMOS and NMOS, the process of the present invention continues by heavily-implanting dopants into the upper portions of regions 16 and 22 to ensure sufficient proximity to the surface of substrate 4 so that subsequent connections to Gnd and Vdd, respectively, may be established. At the same time, heavily-doped regions 18-2, 20-2, 10-2 and 12-2 will be formed. Referring to FIG. 2G, a sixth photoresist 40 is disposed over substrate 4 and patterned to open areas directly above diffused region 16 and the PMOS, particularly the areas above spaced-apart regions 18 and 20. With photoresist 40 as a mask, regions 16, 18 and 20 are heavily doped with $BF_2$ at a dose of approximately $10^{14}$ to $5\times10^{15}$ per $cm^2$ at an energy of approximately between 20 KeV to 80 KeV. With regard to spaced-apart regions 18 and 20, because sidewall oxides 28 also act as masks, only regions 18-2 and 20-2 are implanted thereby forming heavily-doped regions. Spaced-apart region 18 therefore includes lightly-doped region 18-1 and heavily-doped region 18-2, and spaced-apart region 20 includes lightly-doped region 20-1 and heavily-doped region 20-2. Photoresist 40 is then removed.

Figure 2H:
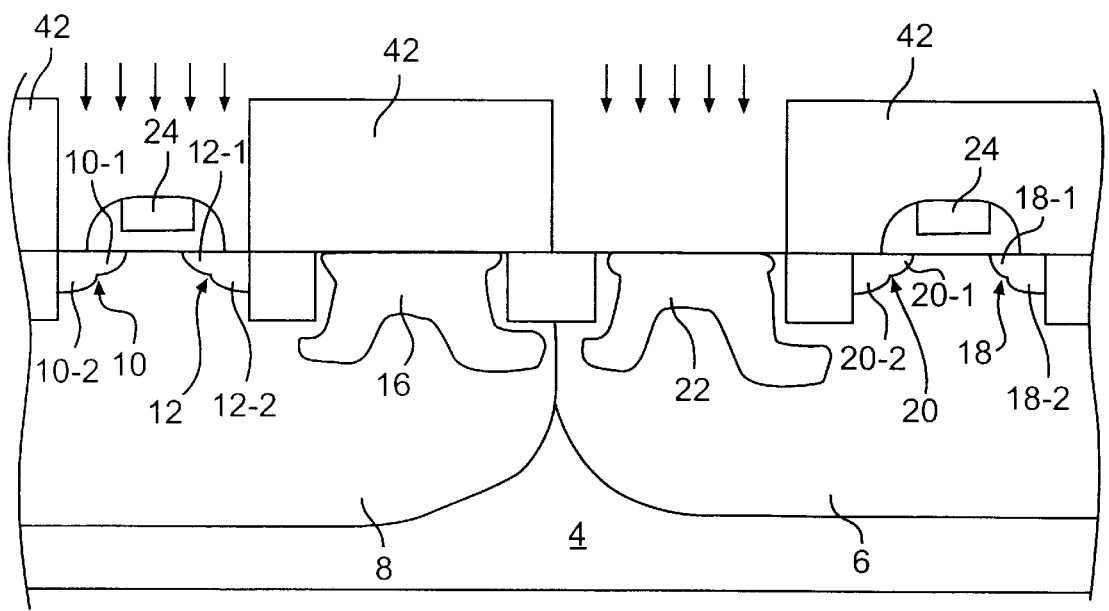

Diffused region 22 is likewise doped. Referring to FIG. 2H, a seventh photoresist 42 is disposed over substrate 4 and patterned to open areas directly above diffused region 22 and the NMOS, particularly the areas above spaced-apart regions 10 and 12. With photoresist 42 as a mask, regions 22, 10 and 12 are heavily doped with P or As at a dose of approximately $10^{14}$ to $5\times10^{15}$ per $cm^2$ at an energy of approximately between 20 KeV to 80 KeV. With regard to spaced-apart regions 10 and 12, because sidewall oxides 28 act as masks, only regions 10-2 and 12-2 are implanted thereby forming heavily-doped regions. Spaced-apart region 10 therefore includes lightly-doped region 10-1 and heavily-doped region 10-2, and spaced-apart region 12 includes lightly-doped region 12-1 and heavily-doped region 12-2. Photoresist 42 is then removed. The method of the present invention continues with known steps of forming inter-layer dielectrics, forming contacts and metalization.

It will also be apparent to those skilled in the art that various modifications and variations can be made in the disclosed product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a semiconductor device having a buried guard ring, comprising:

forming a plurality of shallow trenches in a substrate;

providing a first photoresist over said substrate;

patterning and defining said photoresist;

implanting said substrate with a dopant to form said buried guard ring for sinking charged carriers, said buried guard ring extending underneath at least one of said plurality of shallow trenches;

removing said photoresist;

oxidizing said substrate to grow oxides inside said plurality of shallow trenches to form a plurality of shallow trench isolations;

forming an MOS device over said substrate, including the steps of implanting a first dose of dopants to form spaced-apart regions, and forming a gate structure including a gate electrode and a gate insulator having spacer oxides, and implanting a second dose of dopants into said buried guard ring and said spaced-apart regions, said second dose of dopants being more concentrated than said first dose of dopants.

2. The method as claimed in claim 1 wherein said step of forming a plurality of shallow trenches includes the steps of, providing a second photoresist over said substrate;

patterning and defining said second photoresist to form a plurality of openings;

etching said substrate through said plurality of openings in said second photoresist to form a plurality of shallow trenches; and removing said second photoresist.

3. The method as claimed in claim 1 wherein said step of implanting a second dose of dopants comprises a step of implanting phosphorus at a dose of approximately $10^{12}$ to $10^{14}$ per $cm^2$ at an energy of approximately between 20 KeV to 60 KeV.

4. The method as claimed in claim 1 wherein said step of implanting a second dose of dopants comprises a step of implanting arsenic at a dose of approximately $10^{12}$ to $10^{14}$ per $cm^2$ at an energy of approximately between 20 KeV to 60 KeV.

5. The method as claimed in claim 1 wherein said step of implanting a second dose of dopants comprises a step of implanting $BF_2$ at a dose of approximately $10^{12}$ to $5\times10^{12}$ per $cm^2$ at an energy of approximately between 20 KeV to 60 KeV.

6. The method as claimed in claim 1 wherein said step of implanting said substrate to form a diffused region comprises a step of implanting said substrate to form a substantially upside-down U-shaped diffused region.

7. The method as claimed in claim 1 wherein said step of implanting a second dose of dopants comprises, providing a third photoresist over said substrate;

patterning and defining said third photoresist to form a plurality of openings over said diffused region and said spaced-apart regions;

implanting dopants through said third photoresist; and removing said third photoresist.

8. The method as claimed in claim 7 wherein said step of implanting a second dose of dopants comprises a step of implanting $BF_2$ at a dose of approximately $10^{14}$ to $5\times10^{15}$ per cm² at an energy of approximately between 20 KeV to 80 KeV.

9. The method as claimed in claim 7 wherein said step of implanting dopants comprises a step of implanting phosphorus at a dose of approximately $10^{14}$ to $5 \times 10^{15}$ per cm² at an energy of approximately between 20 KeV to 80 KeV.

10. The method as claimed in claim 7 wherein said step of implanting dopants comprises a step of implanting arsenic at a dose of approximately $10^{14}$ to $5 \times 10^{15}$ per cm² at an energy of approximately between 20 KeV to 80 KeV.

* * * * *